United States Patent
Kumar et al.

(10) Patent No.: US 9,551,865 B1
(45) Date of Patent: Jan. 24, 2017

(54) ELECTROWETTING ELEMENT WITH PHOTOSENSOR

(71) Applicant: Amazon Technologies, Inc., Seattle, WA (US)

(72) Inventors: Abhishek Kumar, Tilburg (NL); Toru Sakai, Waalre (NL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/071,024

(22) Filed: Mar. 15, 2016

(51) Int. Cl.
| G02B 26/02 | (2006.01) |
| G02B 26/00 | (2006.01) |
| H01L 31/14 | (2006.01) |
| H01L 21/66 | (2006.01) |
| H01L 27/12 | (2006.01) |

(52) U.S. Cl.
CPC .............. *G02B 26/005* (2013.01); *H01L 22/14* (2013.01); *H01L 27/1222* (2013.01); *H01L 31/145* (2013.01)

(58) Field of Classification Search
CPC ...... G02B 26/004; G02B 26/005; H01L 22/12
See application file for complete search history.

(56) References Cited

U.S. PATENT DOCUMENTS

| 7,515,340 | B1* | 4/2009 | Shiu | G02B 26/005 359/462 |
| 7,548,363 | B2* | 6/2009 | Hayes | G02B 26/005 359/253 |
| 7,760,420 | B2* | 7/2010 | Cheng | G02B 26/005 359/228 |
| 8,059,328 | B1* | 11/2011 | Kuo | G02B 26/005 359/290 |
| 8,174,772 | B1* | 5/2012 | DeVaul | G02B 26/005 136/243 |
| 8,189,267 | B2* | 5/2012 | Slack | G02B 26/005 359/665 |
| 8,350,783 | B2* | 1/2013 | Feenstra | G02B 26/005 345/211 |
| 8,427,754 | B2* | 4/2013 | Missbach | G02B 26/005 359/665 |
| 8,520,286 | B2* | 8/2013 | Clapp | G02B 26/005 252/586 |
| 8,547,623 | B2* | 10/2013 | Parry-Jones | G02B 26/005 345/173 |
| 2016/0195709 | A1* | 7/2016 | Kinoshita | G02F 1/17 359/290 |

* cited by examiner

Primary Examiner — Evan Pert
(74) Attorney, Agent, or Firm — EIP US LLP

(57) ABSTRACT

An electrowetting element comprising a photosensor. The photosensor comprises a photosensitive material overlapped by an electrowetting element electrode; a first photosensor contact in contact with the photosensitive material; and a second photosensor contact in contact with the photosensitive material.

20 Claims, 5 Drawing Sheets

ELECTROWETTING ELEMENT WITH PHOTOSENSOR

BACKGROUND

A brightness of a display effect emitted by an electrowetting display element may be measured using an external light detector. However, this can be cumbersome, time consuming, and require costly detection apparatus.

It is desirable to improve detection of light transmitted through at least part of an electrowetting element.

DETAILED DESCRIPTION

Examples are described herein of an electrowetting element comprising a photosensor. A photosensitive material of such a photosensor is overlapped by an electrode, and can detect an amount of light incident on the photosensor, in dependence on a configuration of first and second fluids in the element. By measuring a current generated by the photosensitive material, indicative of the amount of light on the photosensor, a voltage applied to a matrix of electrowetting elements may be adjusted, to obtain more closely a desired configuration of the fluids. With the photosensor within the electrowetting element, a more compact and effective feedback control of fluid configurations is realized. The photosensor may also be used to monitor dispensing of first fluid during manufacture of electrowetting elements, to improve a homogeneity and/or a desired thickness of the first fluids. Further details are explained below.

Figure 1:
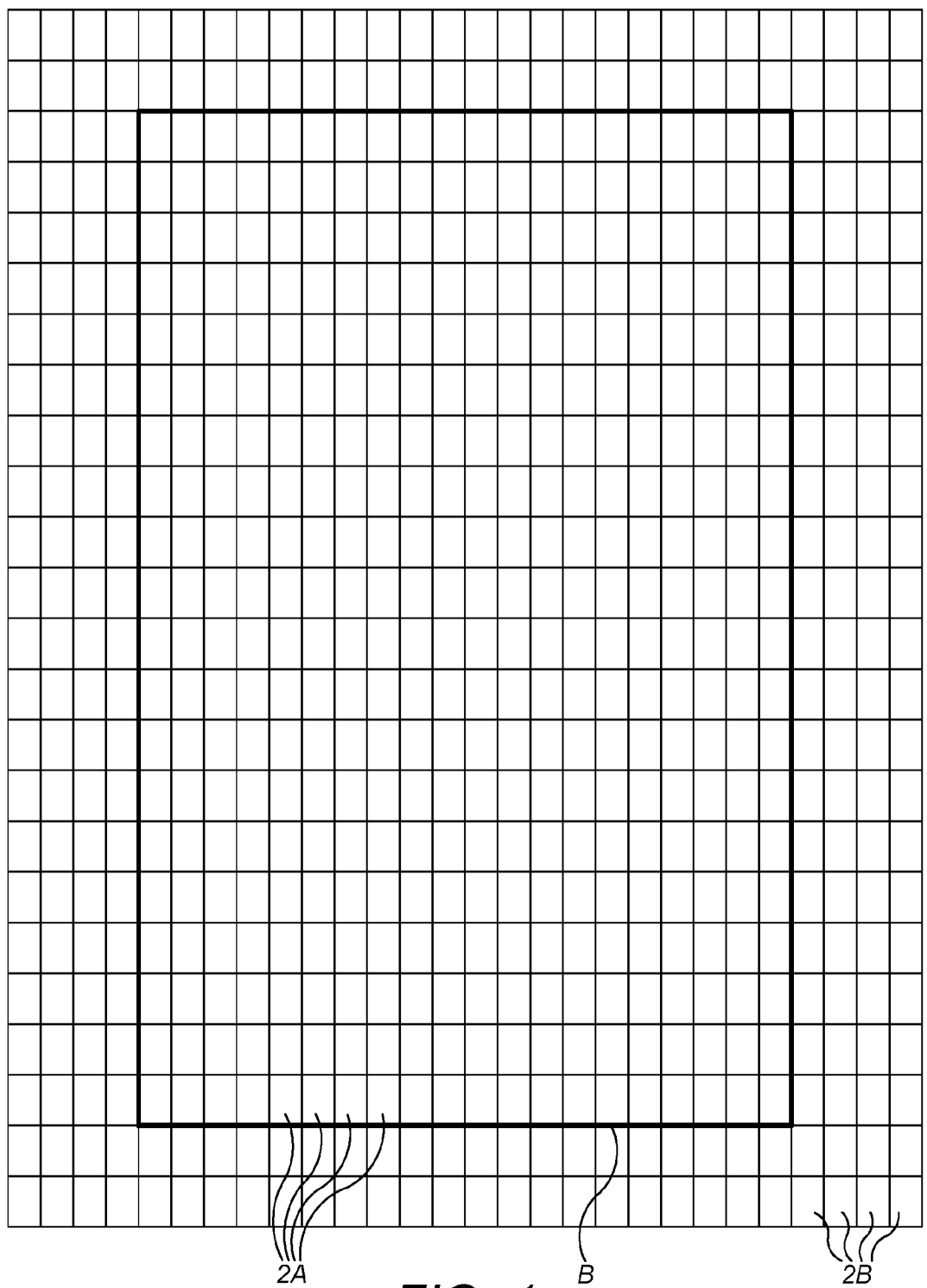
FIG. 1 shows schematically an example array of electrowetting elements.

FIG. 1 shows schematically a display device 1 according to examples, which includes a plurality of electrowetting elements 2. Such electrowetting elements may otherwise be considered to be display elements or picture elements, each configurable to emit a display effect which together form an image displayed by display device. An electrowetting element may in some examples be considered a pixel and in other examples a sub-pixel.

In examples, the display device has a plurality of first electrowetting elements 2A and at least one, in examples a plurality, of second electrowetting elements 2B. The plurality of first electrowetting elements 2A may be arranged as a matrix of electrowetting elements, with m rows and n columns, m and n each independently being an integer. In the example of FIG. 1, the matrix of first electrowetting elements has 20 columns and 20 rows of electrowetting elements. Surrounding the matrix, is a plurality of second electrowetting elements 2B in a region outside the matrix, in this case forming a border region surrounding, or framing, the matrix. Such a border region in FIG. 1 is 2 electrowetting elements wide on two opposing sides of the matrix, and 4 electrowetting elements wide on the other two opposing sides of the matrix. It is to be appreciated that in other examples there may be greater or fewer rows and/or columns of electrowetting elements in the first plurality, and that the width of the border region may be wider or narrower, for example with 8 and 16 electrowetting elements instead of 2 and 4 as illustrated. A boundary B between the matrix and the border region is indicated by the bold line in FIG. 1.

Figure 2:
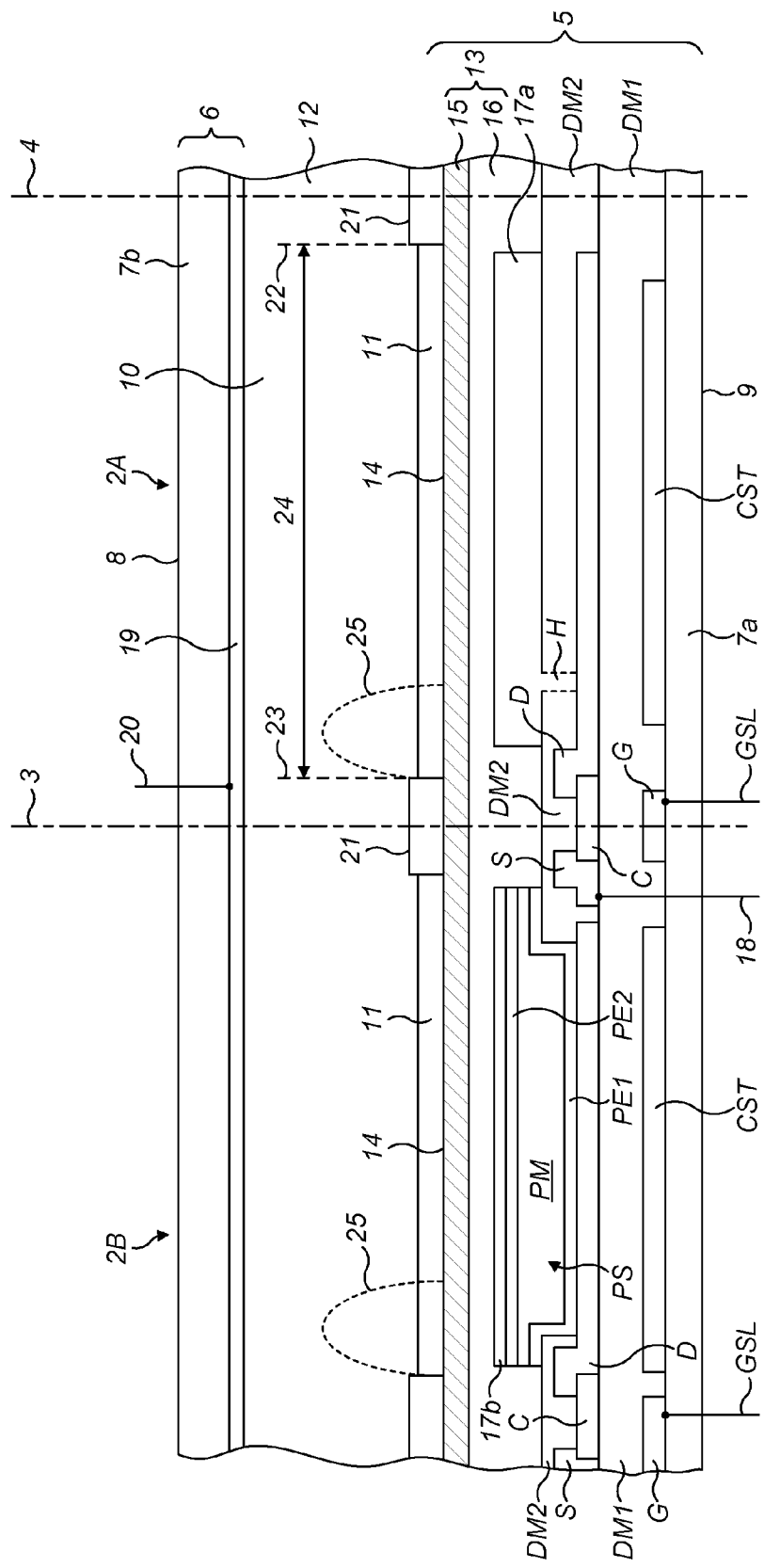
FIG. 2 shows schematically a cross section of parts of two electrowetting elements.

Referring now to FIG. 2, there is illustrated on the right hand side an electrowetting element without a photosensor, in other words not including a photosensor, and on the left hand side an electrowetting element comprising a photosensor. The former may be considered a first electrowetting element 2A and the latter a second electrowetting element 2B. Thus, FIG. 2 illustrates a cross section across the boundary B of FIG. 1.

Features of the first electrowetting element 2A, otherwise referred to as a display element, as one of a plurality of first electrowetting elements of a display device, will first be described. Then, features of the second electrowetting element 2B will be described.

The lateral extent of the electrowetting element is indicated in FIG. 2 by two dashed lines 3,4. The display element comprises a first support plate 5 and a second support plate 6. The support plates may be separate parts of each display element, but the support plates may be shared in common by the plurality of display elements. The support plates may include a glass or polymer substrate 7a, 7b and may be rigid or flexible. An electrowetting element may correspond to a region taken between respective outer sides of the substrates of the first and second support plates, and having the lateral extent indicated by the dashed lines 3, 4.

The display device has a viewing side 8 on which an image or display formed by the display device can be viewed and a rear side 9. In FIG. 2, a surface of the first support plate 5, which surface is in this example a surface of the substrate 7a, corresponds to the rear side 9; a surface of the second support plate 6, which surface is in this example a surface of the substrate 7b of the second support plate, corresponds to the viewing side 8; alternatively, in other examples, a surface of the first support plate may correspond to the viewing side. The display device may be of the reflective, transmissive or transflective type. The display device may be of a segmented display type in which the image may be built up of segments, each segment including several display elements. The display device may be an active matrix driven display device, with appropriate circuitry, as is known to the skilled person. The plurality of display elements may be monochrome. For a color display device the display elements may be divided in groups, each group having a different color; alternatively, an individual display element may be able to show different colors.

A space 10 between the support plates is filled with two fluids: a first fluid 11 and a second fluid 12 at least one of which may be a liquid. The first and second fluids are therefore disposed between the first and second support plates. The second fluid is immiscible with the first fluid. Therefore, the first fluid and the second fluid do not substantially mix with each other and in some examples do not mix with each other to any degree. The immiscibility of the first and second fluids is due to the properties of the first and second fluids, for example their chemical compositions; the first and second fluids tend to remain separated from each other, therefore tending not to mix together to form a homogeneous mixture of the first and second fluids. Due to this immiscibility, the first and second fluids meet each other at an interface which determines a boundary between the volume of the first fluid and the volume of the second fluid; this interface or boundary may be referred to as a meniscus. With the first and second fluids substantially not mixing with each other, it is envisaged in some examples that there may be some degree of mixing of the first and second fluids, but that this is considered negligible in that the majority of the volume of first fluid is not mixed with the majority of the volume of the second fluid The second fluid is electrically conductive or polar and may be water, or a salt solution such as a solution of potassium chloride in water. The second fluid may be considered an electrolyte. The second fluid may be transparent; it may instead be colored, white, absorbing or reflecting. The first fluid is electrically non-conductive and may for instance be an alkane like hexadecane or may be an oil such as silicone oil.

The first fluid may absorb at least a part of the optical spectrum. The first fluid may be transmissive for a part of the optical spectrum, forming a color filter. For this purpose the first fluid may be colored by addition of pigment particles or a dye. Alternatively, the first fluid may be black, for example absorb substantially all parts of the optical spectrum, for example 90% or more of visible light incident on the first fluid, or reflecting. A reflective first fluid may reflect the entire visible spectrum, making the layer appear white, or part of it, making it have a color.

The support plate 5 includes an insulating layer 13. The insulating layer may be transparent or reflective. The insulating layer 13 may extend between walls of a display element. To avoid short circuits between the second fluid 12 and electrodes arranged under the insulating layer, layers of the insulating layer may extend uninterrupted into a plurality of display elements 2, as shown in FIG. 2. The insulating layer has a surface 14 facing the space 10 of the display element 2 and which is adjoined at least partly by the first fluid. In examples, the support plate has a support plate surface 14, with at least one of the first fluid or the second fluid in contact with the support plate surface 14. In this example the surface 14 is hydrophobic. The thickness of the insulating layer may be less than 2 micrometers and may be less than 1 micrometer.

The insulating layer may be a hydrophobic layer; alternatively, it may include a hydrophobic layer 15 for adjoining the first fluid and a barrier layer 16 with predetermined dielectric properties, the hydrophobic layer 15 being nearer the space 10 than the barrier layer 16, as shown in FIG. 2. The hydrophobic layer is schematically illustrated in FIG. 2 and may be formed of Teflon® AF1600. The barrier layer 16 may have a thickness, taken in a direction perpendicular the plane of the substrate, between 50 nanometers and 500 nanometers and may be made of an inorganic material like silicon oxide or silicon nitride. The hydrophobic layer may be formed of an amorphous fluoropolymer layer such as AF1600 or AF1601 (available from DuPont, 1007 Market St., Wilmington, Del., USA), Hyflon AD® (available from Solvay, Solvay SA, rue de Ransbeek, 310-B-1120 Brussels, Belgium), Cytop (available from AGC Chemicals Europe, Ltd, PO Box 4, York House, Hillhouse International, Thornton Cleveleys, Lancashire FY5 4QD, United Kingdom) or any other low surface energy polymer, for example. It is further envisaged that non-polymer materials may be used to form the hydrophobic layer. In further examples, given the material used for forming the first electrode 17 as explained below, the insulating layer may comprise only a hydrophobic layer, for example with no separate barrier layer may be necessary.

In an off state, where no voltage is applied between the first and second electrodes, described below, the hydrophobic character of the surface 14 causes the first fluid 11 to adhere preferentially to the insulating layer 13, since the first fluid has a higher, for example greater, wettability with respect to the surface of the insulating layer 13 than the second fluid 12. Wettability relates to the relative affinity of a fluid for the surface of a solid. Wettability may be measured by the contact angle between the fluid and the surface of the solid. The contact angle is determined by the difference in surface tension between the fluid and the solid at the fluid-solid boundary. For example, a high difference in surface tension can indicate hydrophobic properties.

Each display element 2 includes a first electrode 17a, otherwise referred to as an electrowetting element electrode, as part of the first support plate 5, for example the first electrode is located in the first support plate. In examples shown there is one such electrode 17a per first electrowetting element. The electrode 17a is separated from the fluids by the insulating layer 13; electrodes of neighboring display elements are electrically isolated from each other by for example a non-conducting layer. In some examples, further layers may be arranged between the insulating layer 13 and the electrode 17a. The electrode 17 can be of any desired shape or form.

In examples a switching element is used to control application of an electric potential to the first electrode 17a and therefore for controlling application of a voltage between the first and second electrodes of a display element. In examples such as those according to FIG. 2, the switching element is a transistor such as a thin film transistor (TFT), which is located in the first support plate. The transistor includes a source terminal S, a drain terminal D which is electrically connected to the first electrode 17a, a channel C connecting the source terminal to the drain terminal and a gate terminal G. The gate terminal G is separated from the channel C by dielectric material which electrically insulates the gate terminal G from the channel C. The source terminal may be supplied with an electric potential by a signal line 18, which is illustrated schematically in FIG. 2. The gate terminal G is supplied with an electric potential by a gate signal line GSL. As is known to the skilled person, an electric potential may be applied to the first electrode 17 by applying a suitable electric potential to the gate terminal; this changes a state of the channel from an electrically non-conducting state to an electrically conducting state. Thus, the transistor may be switched to an electrically conducting state so that the electric potential applied to the source terminal may be conducted via the channel to the first electrode. In other words, a flow of electrical current between the source terminal and the drain terminal, via the channel, is controllable by application of an electric potential to the gate terminal. In an active matrix configuration, the source terminal may be connected by the signal line to a column driver and the gate terminal may be connected by the gate signal line to a row driver, as will be appreciated by the skilled person, to control the magnitude of and when an electric potential is applied to the first electrode, for controlling a configuration of the fluids.

The channel may be formed of a semiconducting material and the drain, source and gate terminals may for example be formed of any of molybdenum (Mo), an alloy including molybdenum (Mo) and chromium (Cr), or aluminum (Al).

In the example of FIG. 2, the gate terminal G is formed as a layer of electrically conductive metal on the substrate 7a of the first support plate. A first layer of dielectric material DM1, for example silicon nitride or silicon dioxide, is formed as an insulating layer on the gate terminal G. A layer of semiconducting material is formed as the channel C on the first layer of dielectric material DM1, the channel at least partly overlapping the gate terminal, with a source terminal and drain terminal each being formed from electrically conductive material. The drain terminal is formed so as to form a plate or layer which at least partly overlaps the first electrode 17a. The source terminal and drain terminal do not contact each other but instead are connected to each other by the channel C, between the drain and source terminals. A second layer of dielectric material DM2, is formed as an insulating layer over the source terminal, the drain terminal and the channel, and also over the plate or layer formed as part of the drain. On this second layer dielectric material DM2 is the first electrode 17a, which has an extent in a plane parallel the display area 14 which at least partly overlaps the display area 14 bounded by walls 21 described below. The first electrode 17a is electrically connected to the drain terminal plate or layer for example by a hole H, for example a contact hole or via, through the second layer of dielectric material DM2. On the second layer of dielectric material DM2 is the insulating layer 13 described above.

In this example, the first electrode 17a is reflective so the display element operates as a reflective display element. A capacitor plate $C_{ST}$ may also be part of the first support plate in this example, for forming a storage capacitor with the plate of the drain terminal acting as the other capacitor plate, separated by the first layer of the dielectric material DM1, the storage capacitor being connected in parallel with the capacitor formed by the first and second electrodes, so that a voltage may be applied between the first and second electrodes for longer after switching the transistor off by removing the electric potential from the gate terminal. The first electrode 17a and the capacitor plate $C_{ST}$ are each formed in this example as layers. Each of the reflector and capacitor plate are formed for example of any of molybdenum (Mo), an alloy including molybdenum (Mo) and chromium (Cr), or aluminum (Al) and are separated from each other and from the first electrode by the layer of dielectric material DM.

The second support plate 6 includes an electrode 19, referred to herein as a second electrode, which may extend between walls of a display element or extend uninterruptedly over a plurality of display elements 2, as shown in the Figure. The electrode 19 is in electrical contact with the second fluid 12 and in this example is common to all display elements. The second electrode in this example is formed as a layer on a surface of the substrate 7b of the second support plate. A second signal line 20 is connected to the second electrode 19. Alternatively, the second electrode may be any element in electrical contact with the second fluid, for applying an electric potential to the second fluid. For example, the second electrode may not be formed as a layer and/or may be arranged at a border of the support plates, where it is in electrical contact with the second fluid. This electrode may be common to all elements, when they are fluidly interconnected by and share the second fluid, uninterrupted by walls. The second electrode in some examples may not form part of either of the first or the second support plates. In other examples, the second electrode may be formed as a pin or multiple elements which are in electrical contact with the second fluid so that an electric potential can be applied to the second fluid. The display element 2 can be controlled by a voltage V applied between the signal lines 18 and 20 and therefore which voltage V is applied between the first electrode and the second fluid. The signal lines 18, 20, GSL may be coupled to a matrix of control lines on the substrate 7a as will be appreciated by the skilled person, with the control lines in turn being coupled to a display driving system for controlling the voltage applied to each display element, to control an image provided by the display device.

The first fluid 11 in this example is confined to one display element by walls 21 that follow the cross-section of the display element. The cross-section of a display element may have any shape; when the display elements are arranged in a matrix form, the cross-section may be square or rectangular. Although the walls are shown as structures protruding from the insulating layer 13, they may instead be at least part of a surface layer of the support plate that repels the first fluid, such as a hydrophilic or less hydrophobic layer. The walls may extend from the first to the second support plate but may instead extend partly from the first support plate to the second support plate as shown in FIG. 2. The extent of the display element, indicated by the dashed lines 3 and 4, is determined by the center of the walls 21. The area of the surface 14 between the walls of a display element, indicated by the dashed lines 22 and 23, is called the display area 24, over which a display effect occurs. The display effect depends on an extent that the first and second fluids adjoin the surface determined by the display area, in dependence on the magnitude of the applied voltage V described above. The magnitude of the applied voltage V therefore determines the configuration of the first and second fluids within the electrowetting element. In other words, the display effect depends on the configuration of the first and second fluid in the display element, which configuration depends on the magnitude of the voltage applied to the electrodes of the display element. When switching the electrowetting element from one fluid configuration to a different fluid configuration the extent of second fluid adjoining the display area surface may increase or decrease, with the extent of first fluid adjoining the display area surface decreasing or increasing, respectively.

Figure 3:
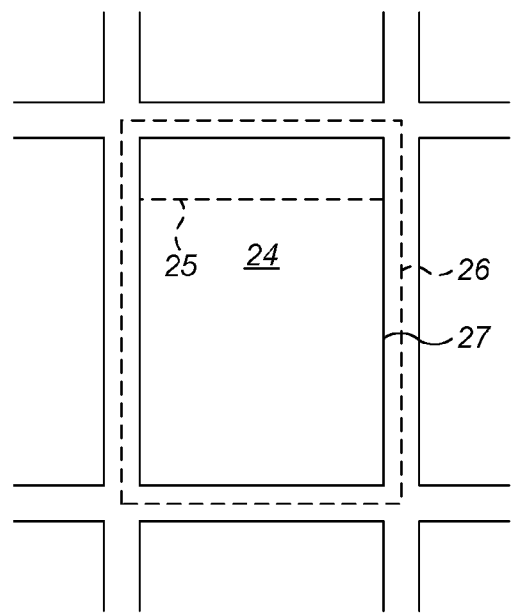
FIG. 3 shows schematically in plan view an example electrowetting display element.

FIG. 3 shows a matrix of rectangular first electrowetting elements in a plan view of the hydrophobic surface 14 in FIG. 2 of the first support plate. The lateral extent of the central picture element in FIG. 3, corresponding to the dashed lines 3 and 4 in FIG. 2, is indicated by the dashed line 26. Line 27 indicates the inner border of a wall; the line is also the edge of the display area 23.

In examples described herein, the first fluid is in contact with at least part of a surface of the first support plate, this surface being in the present example the surface of the hydrophobic layer 15 which provides the display area 24, in other words the support plate surface 14. When a zero or substantially zero voltage is applied between the electrodes 17 and 19, for example when the electrowetting element is in an off state, the first fluid 11 forms a layer between the walls 21, as shown in the FIG. 2. Application of a voltage will retract the first fluid, for example against a wall as shown by the dashed shape 25 in FIG. 2 or FIG. 3. The controllable shape of the first fluid, in dependence on the magnitude of applied voltage, is used to operate the picture element as a light valve, providing a display effect over the display area 23. When applying a voltage to contract the first fluid, the second fluid adjoins or contacts at least part of the surface of the first support plate, in this example the display area 23, the size of area of second fluid adjoinment depending on the extent of first fluid contraction. Thus, when applying a voltage to contract the first fluid, the second fluid displaces part of the first fluid adjoining the surface and in doing so moves the first fluid to the contracted form.

For example, switching the fluids to increase adjoinment of the second fluid with the display area may increase the brightness of the display effect provided by the element.

This display effect determines the display state an observer will see when looking towards the viewing side of the display device. The display state can be from black to white with any intermediate grey state; in a color display device, the display state may also include color.

It is to be noted that in examples each of the plurality of first electrowetting elements has a similar or the same construction as that described as 2A of FIG. 2.

The second electrowetting element 2B of FIG. 2 will now be described. This electrowetting element has many features similar or the same as those described for the first electrowetting element 2A. Such features are labelled with the same reference numerals and corresponding descriptions apply too. Descriptions of such features are not repeated, for conciseness; whereas, different features from the element 2A not yet described will be described. Further, it is to be noted from FIG. 2 that several features of the first electrowetting element 2A are shared or in common with the second electrowetting element 2B, for example the first and second substrates 7a, 7b, the second fluid 12, and various layers of dielectric material continue throughout the first support plate, for example at least as part of the first and second electrowetting elements shown. Hence, as will become clearer later, the plurality of first and second electrowetting elements may be manufactured together, for example by building up layers on the first substrate 7a. Where features are in common or shared or similar features in the same plane, manufacturing may be simplified as these features can be manufactured for all electrowetting elements can be manufactured simultaneously using the same processing steps.

The second electrowetting element 2B comprises a photosensor PS. The photosensor comprises a photosensitive material PM overlapped at least partly by an electrowetting element electrode 17b. This electrode may similar to the electrode 17a, but is for example transmissive for light, for example in the visible spectrum, for example indium tin oxide (ITO), so that light may pass through and reach the photosensitive material PM. Thus, the second photosensor contact may be sufficiently transmissive to light as well as the electrode 17b. The electrode 17b at least partly, in some examples fully, overlaps the support plate surface 14, for example with the extent of the display area 24. The photosensitive material PM is for example formed as a layer which is overlapped at least partly, for example fully, by the electrowetting element electrode 17b. Therefore, a lateral extent of the electrode 17b may correspond with the extent of the display area 24.

A first photosensor contact or electrode PE1 is in contact with the photosensitive material PM. A second photosensor contact or electrode PE2 is also in contact with the photosensitive material PM. The first photosensor contact is for example formed on and in contact with the plate of the drain terminal D, through an opening or aperture in the insulating layer of the second layer of dielectric material DM2. Such an opening may be notably larger than the hole H of the first electrowetting element, for example to ensure a sufficient Ohmic contact with the drain plate or layer and the first photosensor contact PE1. Thus, the first photosensor contact may be at least partly located within the insulating layer opening. The photosensitive material PM may be formed as a layer located between the first and second photosensor contacts with appropriate dimensions for a desired photosensitivity.

The second photosensor contact is for example in contact with the electrode 17b, on which is then formed the insulating layer 13, for example the barrier layer 16. The electrowetting element electrode is therefore located between the first fluid and the photosensitive material.

In other examples, the photosensor may be electrically isolated from the electrode 17b and a drain terminal of the TFT used for controlling a configuration of the fluids. In such examples, the photosensitive material may still be overlapped by the electrode 17b.

Each of the first and second photosensor contacts may be electrically connected respectively to a photosensor electrode signal line. One such photosensor electrode signal line may be connected to a common electrical potential, which may be common to a plurality of photosensors in respective second electrowetting elements, and the other such photosensor electrode signal line may be connected to appropriate circuitry for measuring the magnitude of current output by the photosensitive material. In some examples, the signal line connected to the common electrical potential may be part of a patterned material which also includes the gate terminals of TFTs of first electrowetting elements of a matrix of electrowetting elements for displaying an image. The signal line connected to circuitry for measuring the current from the photosensitive material may be common for a plurality of photosensors, or each photosensor may be individually connected, or connectable with an appropriate switching element such as a TFT, to the signal line for outputting a current of the photosensor to be measured.

A photosensitive material described in examples herein is a material with an electrical current conductive behavior which depends on light incident on the material. For example, such a photosensitive material may generate electrical current, or a resistance to electrical current may change, in response to light incident on the material. Such behavior may depend on a wavelength and/or intensity of light on the photosensitive material.

Such a photosensitive material may comprise or be formed of a photovoltaic material, which generates electrical current in response to incident light. Alternatively the photosensitive material may comprise or be formed of a photoconductive material with an electrical current conductive behavior which changes in response to incident light. For example a resistance to electrical current may change. For example, a conductivity to electrical current may increase in response to incident light.

The photosensitive material is for example a semiconductor material, for example amorphous silicon. In other examples, the photosensitive material comprises for example an electron donor and an electron acceptor material, for example an electron donor such as at least one of poly (3-hexylthiophene-2,5 diyl) (P3HT); poly[N-9'-heptadecanyl-2,7-carbazole-alt-5,5-(4',7'-di-2-thienyl-2',1',3'-benzothiadiazole)] (PCDTBT); poly[[5-(2-ethylhexyl)-5,6-dihydro-4,6-dioxo-4H-thieno[3,4-c]pyrrole-1,3-diyl] (4,4'-didodecyl[2,2'-bithiophene]-5,5'-diyl)] (PBTTPD); poly[2,6-(4,4-bis-(2-ethylhexyl)-4H-cyclopenta [2,1-b;3,4-b]dithiophene)-alt-4,7(2,1,3-benzothiadiazole)] (PCPDTBT); and poly[(5,6-dihydro-5-octyl-4,6-dioxo-4H-thieno[3,4-c]pyrrole-1,3-diyl) [4,4-bis(2-ethylhexyl)-4H-silolo[3,2-b:4,5-b'];dithiophene-2,6-diyl]] (PDTSTPD); and an electron acceptor such as [6,6]-phenyl $C_{61}$ butyric acid methyl ester (PCBM) which may be a $C_{60}$ or $C_{70}$ derivative. For example the photosensitive material comprises a blend or mixture of P3HT and PCBM in a ratio of 1:1 by weight, or a blend or mixture of PCDTBT and PCBM in a ratio of 1:4 by weight. Other photosensitive materials are envisaged, for example. Each of these electron donor and acceptor materials is for example available from Sigma-Aldrich Corp. St. Louis, Mo. USA.

At least one of the first or second photosensor contacts may comprise an Ohmic contact material, which typically exhibits a constant resistance, thus when voltage increases a current flowing through the material does so directly proportionally. For example, the material of the first and/or second photosensor contacts may be a material having a conductivity of greater than 1E-3 (1/Ohm-centimeter) for example n++ silicon. In other examples, at least one of the first or second photosensor contacts may comprise at least one of the following: molybdenum, ITO, silver, gold, platinum, aluminum, or an alloy such as MoCr (with Mo being molybdenum and Cr chromium).

Depending on light incident on the photosensitive material, specifically for example any of: energy of a photon, a wavelength or wavelengths of light, or intensity of light, incident on the photosensitive material, the photosensitive material may generate electrical current and/or change its conductivity to electrical current. Such generation or change in conductivity may be detected by measuring a magnitude of electrical current via the photosensor contacts and the corresponding photosensor electrode signal lines. For example, an increase or generation of electrical current of a given value (for example in Amps) may indicate that light of at least a minimum energy is incident on the photosensitive material. More particularly, for a given current value measurement, at a given moment in time, the energy of light incident on the photosensitive material may be determined. This may be indicative of a wavelength of incident light and/or an intensity or brightness of incident light. In some examples, a biasing voltage may be applied to the photosensitive material via the photosensor electrodes. This may be a positive or negative biasing voltage. A change in electrical current compared with a reference electrical current for the biasing voltage without any light incident on the photosensitive material, may be used to determine characteristics of light incident on the photosensitive material. Such a reference electrical current may otherwise be referred to as a dark current.

The circuitry connected to the photosensor electrode signal lines may for example include at least one processor and/or at least one memory comprising computer program instructions for controlling a configuration of the first fluid and the second fluid in dependence on a magnitude of current output, for example generated, by the photosensitive material. Such circuitry may for example be part of the processor and/or storage described later in relation to FIG. 4, but in other examples may be part of the display device control subsystem described below or of or in addition to a different control subsystem, for example an ambient light detection subsystem. In other examples, described below, such circuitry may be connected to a control system for first fluid dispensing apparatus, for controlling dispensing of first fluid.

For example, for a given current value measured, which value is indicative of the magnitude of current, a look up table or other data may be queried to identify a characteristic of light incident on the photosensitive material. For example, a brightness of light incident on the photosensitive material PM may be measured based on a given magnitude of current. Detecting ambient light is useful for controlling a display device. For example, by determining a brightness of light incident on the photosensitive material, a brightness of a backlight or frontlight of the display device may be changed accordingly, to improve a viewer's viewing experience, for example in terms of image contrast. In other examples, with a low brightness of ambient light, an emission spectrum of a backlight or frontlight may be changed, for example to reduce blue wavelength light with a low ambient brightness.

In other examples, a configuration of the first and second fluids may be determined, and used as a feedback system for providing a desired configuration of the first and second fluids, of first electrowetting elements, and therefore display effect.

For example, computer program instructions of at least one memory such as that below, may be configured to control a configuration of the first fluid and the second fluid of respectively at least one of the first electrowetting elements, in dependence on the magnitude of current output by the photosensitive material of respectively one or more of the second electrowetting element(s).

The computer program instructions and the at least one memory may be configured to, with at least one processor, cause a first voltage to be applied to the second fluid and the electrowetting element of a respective second electrowetting element. The first voltage corresponds with a desired first configuration of the first fluid and the second fluid. The first voltage may be selected on the basis of input image data indicative of a given greyscale for the second electrowetting element to display.

The magnitude of the current output by the photosensitive material PM of the respective second electrowetting element may be measured. With the current magnitude indicating for example a brightness of light on the photosensitive material, and therefore passing through the display area, it can be determined whether or not the first and second fluids are in the desired first configuration, which is expected when applying the first voltage. This may be determined by querying a look up table of data indicative of an expected current magnitude for a given voltage. If it is determined that the first and second fluids have a second configuration, different from the desired first configuration, a second voltage may be determined to be applied, with the aim of adjusting the configuration of the first and second fluids of at least one of the first electrowetting elements (e.g. 2A) to a desired first configuration. Thus, the measured magnitude of the current can be used to determine the voltage magnitude change to change first and second fluids to a desired first configuration. This may be an iterative process, with multiple changes to the applied voltage to obtain a desired fluid configuration. In this way, a feedback process may be established, with the configuration of first and second fluids of at least one first electrowetting element being adjusted in dependence on the current magnitude detected by the photosensor of at least one of the second electrowetting elements. This can therefore improve the quality of a display effect.

Figure 4:
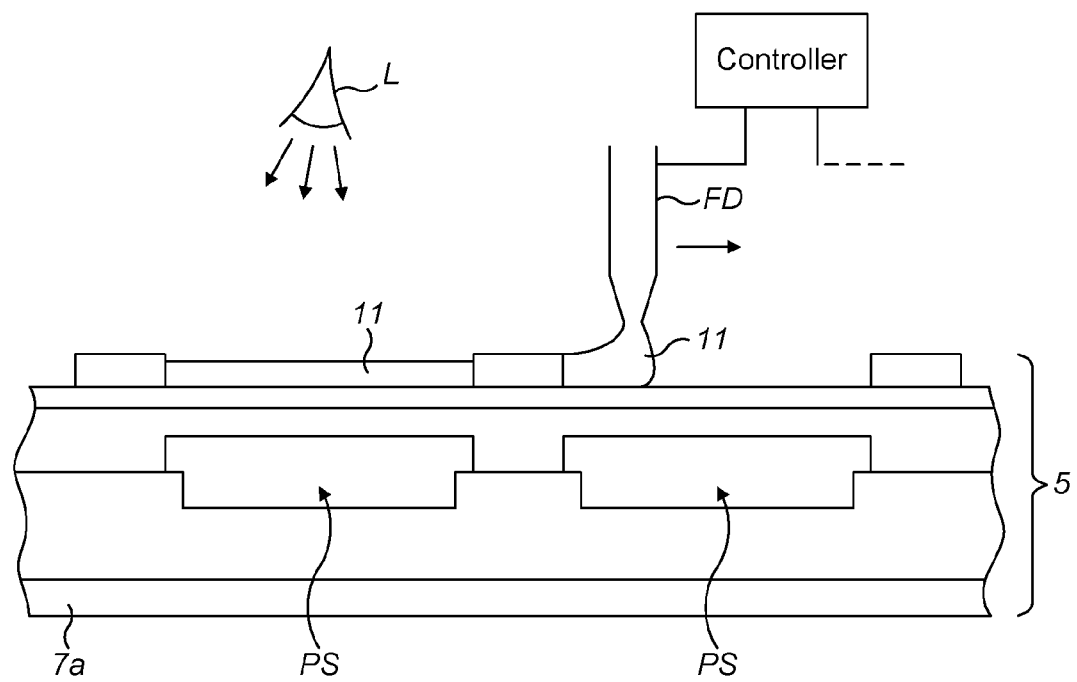
FIG. 4 shows schematically part of an example method of manufacturing an electrowetting element.

FIG. 4 shows schematically part of a method of manufacturing a display device. An assembled first support plate 5 is shown having the first fluid dispensed onto the surface corresponding to the display area. For clarity, not all features of the first support plate described above are shown, but it is to be appreciated that they may be present. The substrate 7a is indicated and two adjacent second electrowetting elements each having a photo sensor PS are shown. The first fluid is dispensed on the surface from a fluid dispenser FD which in this example is moved over the surface in a direction shown with the arrow. The fluid dispenser FD is connected to a controller for controlling operation of the fluid dispenser FD, and which is connected (indicated with the dashed line) to for example the processor of apparatus comprising the first support plate. This processor is for example connected to the photosensors PS and processes data relating to a magnitude of current generated from the photosensitive material of the photosensors PS.

A light source L is indicated as emitting light towards the first support plate. The light source L may not be used in other examples.

Figure 5:
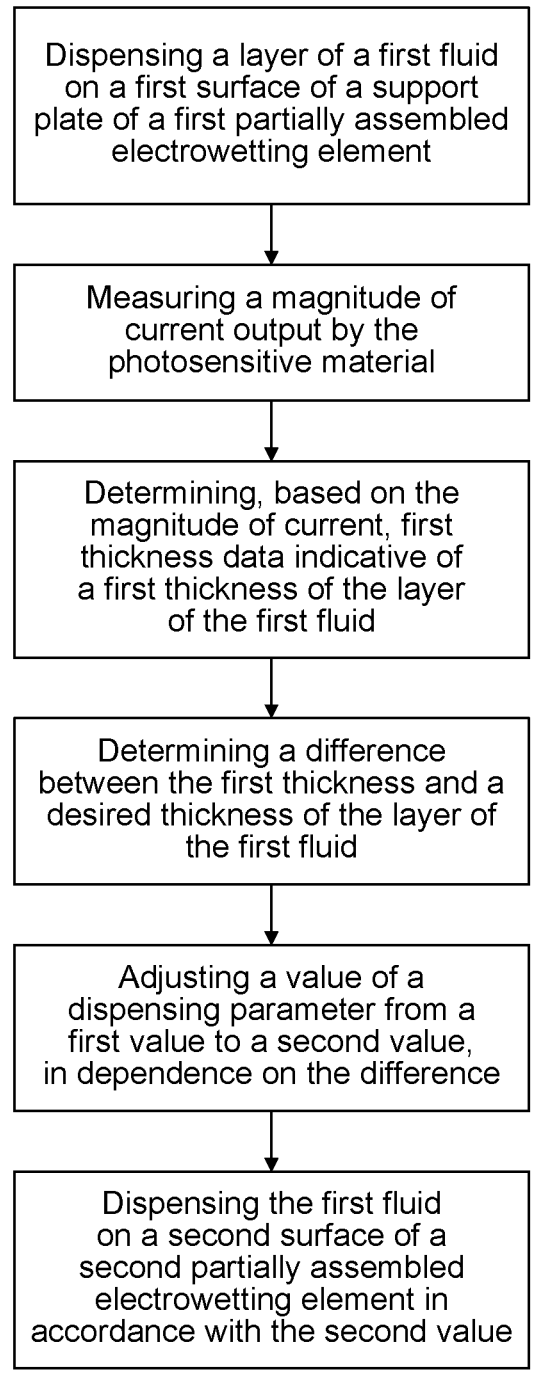
FIG. 5 is a flow diagram relating to examples of a method of manufacturing an electrowetting element.

A first partially assembled electrowetting element is shown on the left hand side of FIG. 4 and a second partially assembled electrowetting element is shown on the right hand side. Referring also to FIG. 5, as the first fluid is dispensed on a first surface of the support plate of the first partially assembled electrowetting element, a magnitude of current output by the photosensitive material of the appropriate photosensor is measured. Based on this magnitude, a first fluid layer thickness may be determined, more specifically first thickness data indicative of a first thickness of the layer of the first fluid. Depending on the thickness of the first fluid layer, the amount of light transmitted through the first fluid can vary, and hence the resulting magnitude of current measured varies accordingly. Hence, using data indicative of a first fluid thickness corresponding to a given current magnitude (and which may use data indicative of a predetermined light intensity of light from the light source applied to the first support plate during dispensing), the first thickness data can be determined. From this, a difference may be determined between the first thickness of the layer of first fluid and a desired thickness of the layer. In dependence on this difference, at least one dispensing parameter may be adjusted from a first value to a second value. This may be controlled by appropriate data communication between the processor connected to the photosensors and the controller of the first fluid dispenser FD, for example by changing the dispensing parameter values. The first fluid may then be dispensed in accordance with the second value, for example by dispensing the first fluid on a second surface of the second partially assembled electrowetting element, to obtain a layer with a thickness closer to the desired thickness. This adjustment may be continuously conducted as the dispenser is moved over a series of adjacent second electrowetting elements which are partially assembled. For example, a column of such second elements may have first fluid dispensed thereon, as the dispensing parameter(s) are adjusted to obtain the desired first fluid thickness. As these elements are outside the matrix of first electrowetting elements, the dispensing parameters may be satisfactorily adjusted by the time the dispenser is moved to dispense first fluid on the support plate surface of the plurality of first electrowetting elements. Thus, the homogeneity of first fluid layers may be improved during manufacture, and without the need for complex and costly external equipment for measuring a first fluid layer thickness.

The dispenser and/or the surface of the support plate may be moved relative to one another during the dispensing. A dispensing parameter may be any of: a speed of moving at least one of the first fluid dispenser or the first surface relative to the other of the first fluid dispenser or the first surface; a flow rate of the first fluid from the first fluid dispenser; or a position of the first fluid dispenser relative to the first surface.

A partially assembled electrowetting element is typically in examples the first support plate described herein, before dispensing of the first and second fluids thereon. In some examples, the first support plate may require further processing actions after the dispensing of the fluids thereon, for example connections to be made to control circuitry. But, the partially assembled electrowetting element may at least comprise a photosensor as described herein so that dispensing of the first fluid may be controlled, and in examples at least also has the layers between the photosensor and the surface (for example of a hydrophobic layer) on which the first fluid is dispensed. The walls may also be present.

Examples are described of electrowetting elements comprising a TFT. In some examples, the second electrowetting element(s) may not include a TFT, whereas in other examples, a TFT may be used to control when a magnitude of current from the photosensor is measured. The TFT may be connected to a photosensor electrode signal line for controlling when the magnitude of current output by the photosensor is measured. In other examples without such a TFT the magnitude of current may be continuously measured, which may be useful when for example controlling first fluid dispensing as just described. An electrowetting element may comprise a further TFT, similar to that described previously, for controlling a voltage applied to the second fluid and the electrode 17b for controlling a configuration of the fluids. In some examples therefore, an electrowetting may have two TFTs; one connected to a photosensor electrode signal line for controlling measuring of current output by the photosensor, and the other for controlling application of a voltage to the electrode 17b and in turn the fluid configuration. As the skilled person will appreciate, appropriate gate signal line circuitry is required, for controlling the gate terminal of each TFT, and thus to switch the TFT to a conducting state or a non-conducting state.

Also, it is noted that where there are multiple photosensors, an average measurement of light incident on a display device may be determined, based on measured current magnitudes from the multiple photosensors. This can give a more accurate indication of external light on the matrix of first electrowetting elements.

Figure 6:
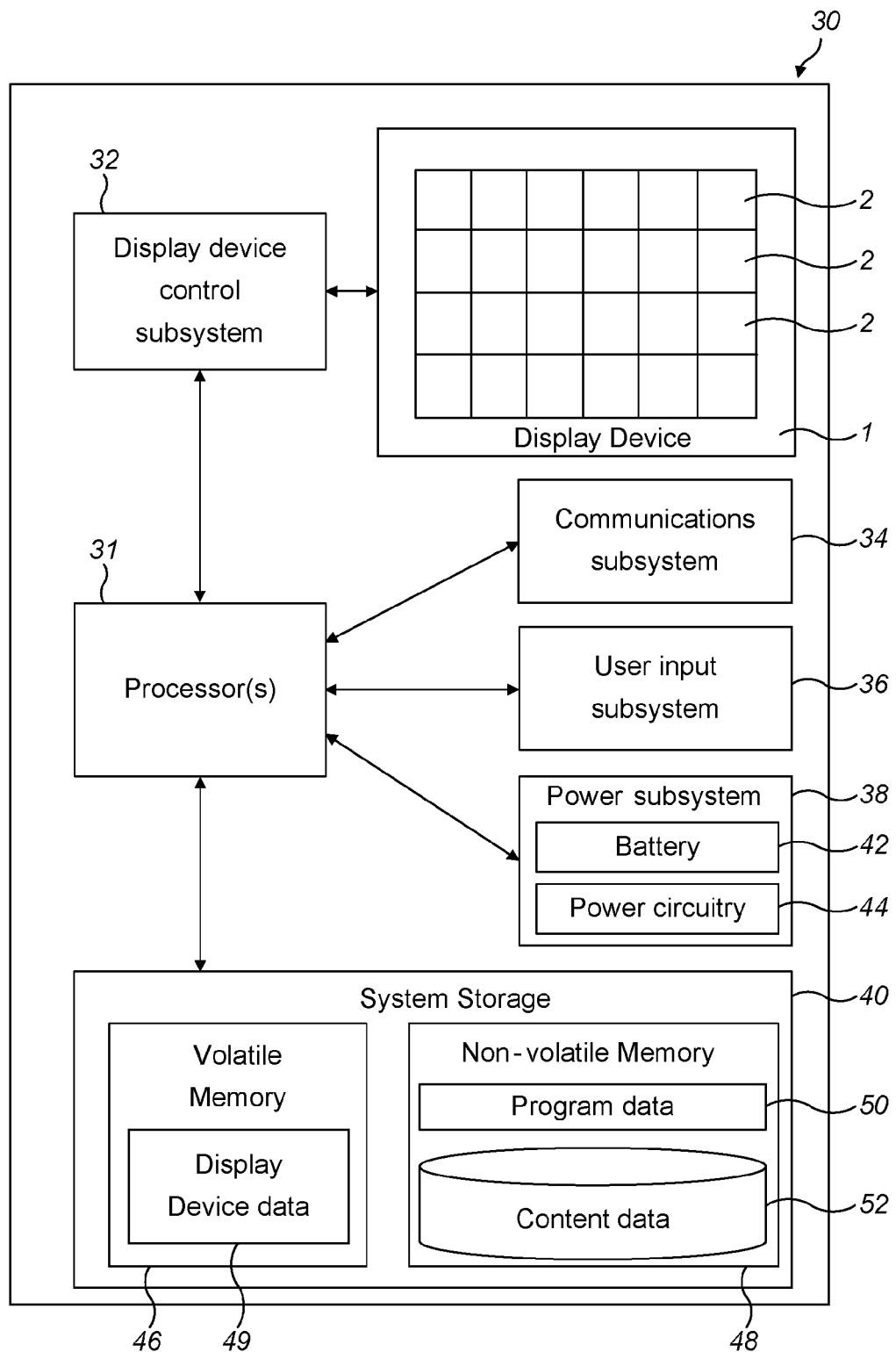
FIG. 6 shows a schematic system diagram of an example apparatus comprising a display device.

FIG. 6 shows schematically a system diagram of an example system, for example apparatus such as electrowetting display apparatus 30, comprising a display device such as any of the examples described above, for example the display device 1 described above comprising a n array or matrix of electrowetting elements 2. The apparatus is for example a portable, for example mobile, device such as an electronic reader device such as a so-called e-reader, a tablet computing device, a laptop computing device, a mobile telecommunications device, a watch or a satellite navigation device; the apparatus may alternatively be a display screen for installation in any machine or device requiring a display screen, for example a consumer appliance.

The system diagram illustrates an example of a basic hardware architecture of the apparatus 30. The apparatus includes at least one processor 31 connected to and therefore in data communication with for example: a display device control subsystem 32, a communications subsystem 34, a user input subsystem 36, a power subsystem 38 and system storage 40. The display device control subsystem is connected to and is therefore in data communication with the display device 1. The at least one processor 31 is for example a general purpose processor, a microprocessor, a digital signal processor (DSP), an application specific integrated circuit (ASIC), a field programmable gate array (FPGA) or other programmable logic device, a discrete gate or transistor logic, discrete hardware components, or any suitable combination thereof designed to perform the functions described herein. A processor may also be implemented as a combination of computing devices, e.g., a combination of a DSP and a microprocessor, a plurality of microprocessors, one or more microprocessors in conjunction with a DSP core, or any other such configuration. The processor may be coupled, via one or more buses, to read information from or write information to one or more memories, for example those of the system storage 40. The at least one processor may additionally, or in the alternative, contain memory, such as processor registers.

The display device control subsystem 32 for example includes electrowetting element driver components, for use in applying a voltage to any of the electrowetting elements, to address different such electrowetting elements. In examples the electrowetting elements are configured according to an active matrix configuration and the display device control subsystem is configured to control switching elements such as thin film transistors (TFTs) of the display device 1 via circuitry to control the electrowetting elements. The circuitry may include signal and control lines such as those described above.

The communications subsystem 34 for example is configured for the apparatus to communicate with for example a computing device via a data network, for example a computer network such as the Internet, a local area network, a wide area network, a telecommunications network, a wired network, a wireless network, or some other type of network. The communications subsystem 34 may further for example comprise an input/output (I/O) interface, such as a universal serial bus (USB) connection, a Bluetooth or infrared connection, or a data network interface for connecting the apparatus to a data network such as any of those described above. Content data as described later may be transferred to the apparatus via the communications subsystem.

The user input subsystem 36 may include for example an input device for receiving input from a user of the apparatus. Example input devices include, but are not limited to, a keyboard, a rollerball, buttons, keys, switches, a pointing device, a mouse, a joystick, a remote control, an infrared detector, a voice recognition system, a bar code reader, a scanner, a video camera (possibly coupled with video processing software to, e.g., detect hand gestures or facial gestures), a motion detector, a microphone (possibly coupled to audio processing software to, e.g., detect voice commands), or other device capable of transmitting information from a user to the device. The input device may also take the form of a touch-screen associated with the display device, in which case a user responds to prompts on the display device by touch. The user may enter textual information through the input device such as the keyboard or the touch-screen.

The apparatus may also include a user output subsystem (not illustrated) including for example an output device for providing output to a user of the apparatus. Examples include, but are not limited to, a printing device, an audio output device including for example one or more speakers, headphones, earphones, alarms, or haptic output devices. The output device may be a connector port for connecting to one of the other output devices described, such as earphones.

The power subsystem 38 for example includes power circuitry 44 for use in transferring and controlling power consumed by the apparatus. The power may be provided by a mains electricity supply or from a battery 42, via the power circuitry. The power circuitry may further be used for charging the battery from a mains electricity supply.

The system storage 40 includes at least one memory, for example at least one of volatile memory 46 and non-volatile memory 48 and may comprise a non-transitory computer readable storage medium. The volatile memory may for example be a Random Access Memory (RAM). The non-volatile (NV) memory may for example be a solid state drive (SSD) such as Flash memory, or Read Only Memory (ROM). Further storage technologies may be used, for example magnetic, optical or tape media, compact disc (CD), digital versatile disc (DVD), Blu-ray or other data storage media. The volatile and/or non-volatile memory may be removable or non-removable.

Any of the memories may store data for controlling the apparatus, for example components or subsystems of the apparatus. Such data may for example be in the form of computer readable and/or executable instructions, for example computer program instructions. Therefore, the at least one memory and the computer program instructions may be configured to, with the at least one processor, control a display effect provided by the electrowetting display device.

In the example of FIG. 6, the volatile memory 46 stores for example display device data 49 which is indicative of display effects to be provided by the display device 1. The processor 31 may transmit data, based on the display device data, to the display device control subsystem 32 which in turn outputs signals to the display device for applying voltages to the electrowetting elements, for providing display effects from the display device. The non-volatile memory 48 stores for example program data 50 and/or content data 52. The program data is for example data representing computer executable instructions, for example in the form of computer software, for the apparatus to run applications or program modules for the apparatus or components or subsystems of the apparatus to perform certain functions or tasks, and/or for controlling components or subsystems of the apparatus. For example, application or program module data includes any of routines, programs, objects, components, data structures or similar. The content data is for example data representing content for example for a user; such content may represent any form of media, for example text, at least one image or a part thereof, at least one video or a part thereof, at least one sound or music or a part thereof. Data representing an image or a part thereof is for example representative of a display effect to be provided by at least one electrowetting element of the electrowetting display device. The content data may include data representing a library of content, for example a library of any of books, periodicals, newspapers, movies, videos, music, or podcasts, each of which may be represented by a collection of data which represents for example one book or one movie. Such a collection of data may include content data of one type, but may instead include a mixture of content data of different types, for example a movie may be represented by data including at least image data and sound data.

Methods of manufacturing a support plate for at least one electrowetting element will now be described such as the first support plate described above. In such examples, a first electrically conductive material is deposited on a substrate such as that labelled 7a above. The first electrically conductive material such as molybdenum is patterned, for example using appropriate masking, to form a gate terminal G and in appropriate examples a storage capacitor plate $C_{ST}$. A dielectric material DM1 is deposited on the gate terminal G and in appropriate examples the storage capacitor plate $C_{ST}$. A channel C is formed on the dielectric material DM1 by for example depositing a channel material on the dielectric material DM1 with appropriate masking. A second electrically conductive material for example molybdenum is deposited on the channel material, which second electrically conductive material is patterned, for example using appropriate masking, to form the drain terminal D and source terminal S, and in some examples also the electrowetting element electrode 17. The first and second electrically conductive materials each may be deposited using for example a physical vapor deposition (PVD) technique such as sputtering, with an appropriate mask, as would be appreciated by the skilled person. The dielectric material DM may be deposited using a chemical vapor deposition (CVD) technique. The channel may be formed for example of a semiconducting material, for example amorphous silicon, for example as the skilled person will understand, using a CVD technique such as plasma enhanced CVD (PECVD) or low pressure CVD (LPCVD), at a temperature in the range of 250 to 400 degrees Celsius and for example for PECVD at a pressure of for example 1 torr. Appropriate masking may be used. A second layer of dielectric material DM2 may then be deposited, followed by forming at least one opening through the dielectric material DM2. For a second electrowetting element to comprise a photosensor, such an opening is notably larger than in a first electrowetting element. Then, for any second electrowetting elements, a first photosensor contact layer is deposited, for example within the opening and in contact with a plate formation of the drain terminal. Then, a layer of photosensitive material (e.g. amorphous silicon) is deposited on the first photosensor contact layer, followed in turn by a second photosensor contact layer on the photosensitive material. It is to be understood that appropriate deposition, masking and/or lithography techniques may be used as the skilled person will appreciate. Then, in the first electrowetting elements the electrode (e.g. 17a) is deposited of for example a reflective metal. In contrast, in the second electrowetting element(s) the electrode (e.g. 17b) is deposited on the second photosensor contact, and is for example transmissive to light, for example ITO. With the photosensitive material being for example amorphous silicon, in common with the material forming the channel, a manufacturing process of an electrowetting element may be simplified, as the same apparatus may be used for forming both the channel and the photosensitive material, rather than needing different apparatus.

The insulating layer may then be formed, which may involve forming the barrier layer using CVD for example, followed by depositing, for example spin coating, a layer of the hydrophobic material thereon, which hydrophobic layer at least partly overlaps the electrowetting element electrode. Finally, the walls may be formed on the hydrophobic layer, by for example appropriate masking and developing of a photoresist such as SUB, to complete manufacture of the first support plate. The first fluid may then be dispensed on the hydrophobic layer, and the second fluid dispensed appropriately.

To assemble the electrowetting display device, the first support plate and the second support plate may be joined together, using a seal element, with the first fluid and the second fluid having been provided between the first and second support plates, as would be readily appreciated by the skilled person.

The above examples are to be understood as illustrative examples. Further examples are envisaged. It is to be understood that any feature described in relation to any one example may be used alone, or in combination with other features described and may also be used in combination with one or more features of any other of the examples, or any combination of any other of the examples. Furthermore, equivalents and modifications not described above may also be employed without departing from the scope of the accompanying claims.

What is claimed is:

1. An electrowetting element comprising:
   a first fluid;
   a second fluid immiscible with the first fluid; and
   a support plate having a support plate surface, at least one of the first fluid or the second fluid in contact with the support plate surface, the support plate comprising:
      an electrowetting element electrode;
      a photosensor comprising:
         a photosensitive material overlapped by the electrowetting element electrode;
         a first photosensor contact in contact with the photosensitive material; and
         a second photosensor contact in contact with the photosensitive material.

2. The electrowetting element according to claim 1, the photosensitive material comprising at least one material selected from the group consisting of: a semiconductor material; amorphous silicon; poly (3-hexylthiophene-2,5 diyl) (P3HT); [6,6]-phenyl $C_{61}$ butyric acid methyl ester (PCBM); poly[N-9'-heptadecanyl-2,7-carbazole-alt-5,5-(4', 7'-di-2-thienyl-2',1',3'-benzothiadiazole)] (PCDTBT); poly [[5-(2-ethylhexyl)-5,6-dihydro-4,6-dioxo-4H-thieno[3,4-c] pyrrole-1,3-diyl](4,4'-didodecyl[2,2'-bithiophene]-5,5'-diyl)] (PBTTPD); poly[2,6-(4,4-bis-(2-ethylhexyl)-4H-cyclopenta [2,1-b;3,4-b']dithiophene)-alt-4,7(2,1,3-benzothiadiazole)] (PCPDTBT); and poly[(5,6-dihydro-5-octyl-4,6-dioxo-4H-thieno[3,4-c]pyrrole-1,3-diyl)[4,4-bis (2-ethylhexyl)-4H-silolo[3,2-b:4,5-b';]dithiophene-2,6-diyl]] (PDTSTPD).

3. The electrowetting element according to claim 1, further comprising: a transistor with a channel, the channel and the photosensitive material each comprising amorphous silicon.

4. The electrowetting element according to claim 1, at least one of the first photosensor contact or the second photosensor contact comprising an Ohmic contact material.

5. The electrowetting element according to claim 1, at least one of the first photosensor contact or the second photosensor contact comprising n++ silicon.

6. The electrowetting element according to claim 1, the electrowetting element electrode comprising a material transmissive to light in the visible spectrum.

7. The electrowetting element according to claim 1, the electrowetting element electrode comprising indium tin oxide (ITO).

8. The electrowetting element according to claim 1, the photosensitive material located between the first photosensor contact and the second photosensor contact.

9. The electrowetting element according to claim 1, the electrowetting element electrode located between the first fluid and the photosensitive material.

10. The electrowetting element according to claim 1, further comprising
    an insulating layer having an opening; and
    a thin film transistor having a:
       a gate terminal;
       a source terminal; and
       a drain terminal,
    the first photosensor contact at least partly located within the opening and in contact with the drain terminal.

11. An apparatus comprising:
    a plurality of first electrowetting elements not comprising a photosensor;
    a second electrowetting element, each electrowetting element of the plurality of first electrowetting elements and the second electrowetting element respectively comprising:
a first fluid;
a second fluid immiscible with the first fluid; and
an electrowetting element electrode,
the second electrowetting element comprising a photosensor comprising:
a photosensitive material overlapped by the electrowetting element electrode;
a first photosensor contact in contact with the photosensitive material; and
a second photosensor contact in contact with the photosensitive material,
at least one processor; and
at least one memory comprising computer program instructions, the at least one memory and the computer program instructions being configured to, with the at least one processor, control a configuration of the first fluid and the second fluid of a first electrowetting element of the plurality of first electrowetting elements, in dependence on a magnitude of current output by the photosensitive material of the second electrowetting element.

12. The apparatus according to claim 11, the plurality of first electrowetting elements being a matrix of the first electrowetting elements, and the second electrowetting element located in a region outside the matrix of the first electrowetting elements.

13. The apparatus according to claim 11, wherein the second electrowetting element is part of a plurality of second electrowetting elements surrounding the plurality of first electrowetting elements.

14. The apparatus according to claim 11, the photosensitive material comprising amorphous silicon, and the first photosensor contact and the second photosensor contact each comprising n++ silicon.

15. The apparatus according to claim 11, the at least one memory and the computer program instructions being configured to, with the at least one processor:
cause a first voltage to be applied to the second fluid and the electrowetting element electrode of the second electrowetting element, the first voltage corresponding to a desired first configuration of the first fluid and the second fluid of the second electrowetting element;
measure the magnitude of the current output by the photosensitive material of the second electrowetting element;
determine, based on the magnitude of the current, that the first fluid and the second fluid of the second electrowetting element have a second configuration different from the first configuration;
determine, based on the magnitude of the current, a second voltage to be applied to the second fluid and the electrowetting element electrode of a respective first electrowetting element of the plurality of first electrowetting elements; and
cause the second voltage to be applied to the second fluid and the respective first electrowetting element electrode.

16. A method of manufacturing a display device, comprising:
dispensing a layer of a first fluid on a first surface of a support plate of a first partially assembled electrowetting element, the support plate comprising a photosensor, the photosensor comprising: a photosensitive material; a first photosensor contact in contact with the photosensitive material; and a second photosensor contact in contact with the photosensitive material;
measuring a magnitude of current output by the photosensitive material;
determining, based on the magnitude of current, first thickness data indicative of a first thickness of the layer of the first fluid;
determining a difference between the first thickness and a desired thickness of the layer of the first fluid;
adjusting a value of a dispensing parameter from a first value to a second value, in dependence on the difference; and
dispensing the first fluid on a second surface of a second partially assembled electrowetting element in accordance with the second value.

17. The method according to claim 16, further comprising:
during the dispensing the layer of the first fluid, moving at least one of a first fluid dispenser or the first surface relative to at least the other of the first fluid dispenser or the first surface,
the dispensing the layer of the first fluid comprising dispensing the first fluid from the first fluid dispenser,
the dispensing parameter being:
a speed of the moving the at least one of the first fluid dispenser or the first surface relative to the at least the other of the first fluid dispenser or the first surface;
a flow rate of the first fluid from the first fluid dispenser; or
a position of the first fluid dispenser relative to the first surface.

18. The method according to claim 16, further comprising:
during the measuring the magnitude of the current output by the photosensitive material, applying light of a predetermined light intensity on the layer of the first fluid,
the determining the first thickness data comprising determining the first thickness data based on the magnitude of the current output by the photosensitive material during the applying the light of the predetermined light intensity on the layer of the first fluid.

19. The method according to claim 16, the photosensitive material comprising amorphous silicon, and the first photosensor contact and the second photosensor contact each comprising n++ silicon.

20. The method according to claim 16, the first partially assembled electrowetting element located outside a matrix of partially assembled electrowetting elements, each of the matrix of partially assembled electrowetting elements not comprising a photosensor.

* * * * *

UNITED STATES PATENT AND TRADEMARK OFFICE
CERTIFICATE OF CORRECTION

PATENT NO.        : 9,551,865 B1
APPLICATION NO.   : 15/071024
DATED             : January 24, 2017
INVENTOR(S)       : Kumar et al.

It is certified that error appears in the above-identified patent and that said Letters Patent is hereby corrected as shown below:

In Column 16, Line 20, in Claim 2, delete "-2,5" and insert -- -2,5- --, therefor.

In Column 16, Line 56, in Claim 10, delete "comprising" and insert -- comprising: --, therefor.

In Column 16, Line 58, in Claim 10, delete "having a:" and insert -- having: --, therefor.

Signed and Sealed this
Nineteenth Day of September, 2017

Joseph Matal
*Performing the Functions and Duties of the*
*Under Secretary of Commerce for Intellectual Property and*
*Director of the United States Patent and Trademark Office*